(12) United States Patent
Koch et al.

(10) Patent No.: US 7,652,398 B2
(45) Date of Patent: Jan. 26, 2010

(54) MAGNETIC LOGIC DEVICE

(75) Inventors: Reinhold Koch, Berlin (DE); Carsten Pampuch, Berlin (DE); Andreas Ney, Berlin (DE); Klaus H. Ploog, Schöneiche (DE)

(73) Assignee: Forschungsverbund Berlin e.V., Berlin (DE)

( * ) Notice: Subject to any disclaimer, the term of this patent is extended or adjusted under 35 U.S.C. 154(b) by 605 days.

(21) Appl. No.: 10/536,699

(22) PCT Filed: Nov. 26, 2003

(86) PCT No.: PCT/EP03/13318

§ 371 (c)(1),
(2), (4) Date: Dec. 22, 2006

(87) PCT Pub. No.: WO2004/051853

PCT Pub. Date: Jun. 17, 2004

(65) Prior Publication Data
US 2006/0164124 A1 Jul. 27, 2006

(30) Foreign Application Priority Data
Nov. 29, 2002 (DE) .............................. 102 55 857

(51) Int. Cl.
*H03K 17/80* (2006.01)
(52) U.S. Cl. .................. 307/407; 307/408; 307/410; 307/411; 307/415
(58) Field of Classification Search .............. 307/407, 307/408, 411, 415, 410
See application file for complete search history.

(56) References Cited

U.S. PATENT DOCUMENTS

| 5,629,549 A | 5/1997 | Johnson |
| 6,140,838 A | 10/2000 | Johnson |
| 6,359,829 B1 | 3/2002 | Van Den Berg |

(Continued)

FOREIGN PATENT DOCUMENTS

DE  100 53 206 C1  1/2002

(Continued)

OTHER PUBLICATIONS

Machine Translation of German Patent DE 100 53 206 C1 (Bangert et al.), obtained from http://ep.espacenet.com, May 7, 2009.*

(Continued)

*Primary Examiner*—Albert W Paladini
*Assistant Examiner*—Hal I Kaplan
(74) *Attorney, Agent, or Firm*—Schnader Harrison Segal & Lewis LLP

(57) ABSTRACT

A method for operating a magnetic logic device (10) is described wherein at least one output variable $O=F(I_A, I_B)$ is formed from input variables $(I_A, I_B)$ by at least one logic operation with an operator function F of the magnetic logic device (10), whereby the logic device (10) is set at a starting state for executing the operator function F with a certain operator control signal (SET) before the operation, whereby the operator control signal is selected from a group of control signals with which various non-volatile starting states can be set in a controlled manner, each state being characteristic of a different logic function. Furthermore, a magnetic logic device (10) equipped for implementation of this method is also described.

19 Claims, 5 Drawing Sheets

U.S. PATENT DOCUMENTS

Figure 1:
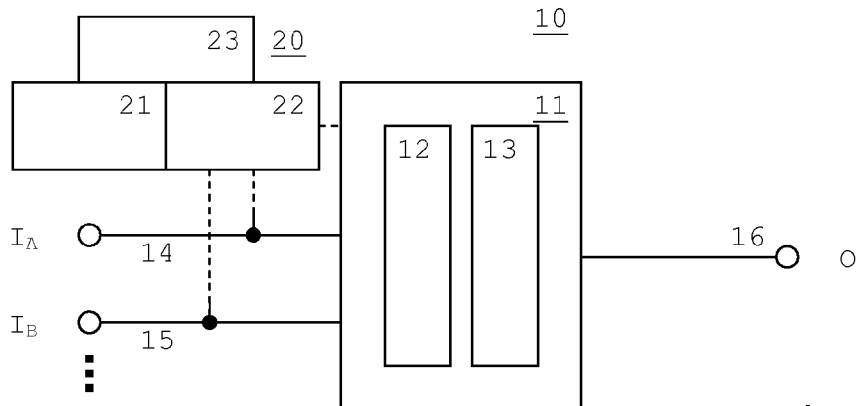

2001/0026158 A1    10/2001    Ohno et al.

FOREIGN PATENT DOCUMENTS

| | | |
|---|---|---|
| DE | 100 36 356 C2 | 3/2002 |
| DE | 101 13 787 C1 | 9/2002 |
| DE | 101 44 395 C1 | 10/2002 |

OTHER PUBLICATIONS

"XMR-Technologien: Magnetoelektrik, Sensorik," "XMR Technologies" Technology Analysis: Magnetism, vol. 2, VDI Technology Center "Physical Technologies," Düsseldorf, Germany, 1997, pp. 11-46 (with English abstract).

W.C. Black, et al., "Programmable logic using giant-magnetoresistance and spin-dependent tunneling devices (invited)," *Journal of Applied Physics*, vol. 87, 2000, pp. 6674-6679.

A. T. Hanbicki, et al., Nonvolatile reprogrammable logic elements using bybrid resonant tunneling diode-giant magnetoresistance circuits, *Applied Physics Letters*, 2001, vol. 79, no. 8, pp. 1190-1192.

T. Gerrits, et al., "Ultrafast precessional magnetization reversal by picosecond magnetic field pulse shaping," *Nature*, vol. 418, 2002, pp. 509-512.

R. Richter, et al., "Field programmable spin-logic realized with tunneling-magnetoresistance devices," *Solid State Electronics*, Elsevier Science Publishers, Barking, GB, 2002, vol. 46, No. 5, pp. 639-643.

A. Ney, et al., "Programmable Computing with a single magnetoresistive element," *Nature*, No. 425, 2003, pp. 485-487.

R. Richter, et al., "Tunneling systems for field programmable spin-logic gates," *Journal of Applied Physics*, 2002, vol. 91, No. 10, pp. 8402-8404.

R. Richter, et al., "Nonvolatile field programmable spin-logic for reconfigurable computing," *Applied Physics Letters, 2002*, vol. 80, No. 7, pp. 1291-1293.

R. Richter, et al., "Field programmable spin-logic based on magnetic tunneling elements," *Journal of Magnetism and Magnetic Materials*, 2002, Elsevier, vol. 240, No. 1-3, pp. 127-129.

"Field Programmable Logic Gates Using GMR Devices" IEEE Transactions on Magnetics, vol. 33, No. 5, Sep. 1997, pp. 3307 to 3309.

"Magneto-Resistive Elements—An alternative to Floating Gate Technologies", 35th Midwest Symposium on Circuits & Systems, vol. 1, 1992, pp. 134-136.

"Logic Devices and Circuits Based on Giant Magnetoresistance", IEEE Transactions on Magnetics, vol. 33, No. 6, Nov. 1997, pp. 4492 to 4497.

\* cited by examiner

A

B (state of the art)

MAGNETIC LOGIC DEVICE

This invention relates to methods of operating a magnetic logic device with which at least one logic output variable is formed from logic input variables in at least one logic operation with a magnetic component. This invention also relates to magnetic logic devices for performing such methods and logic circuits equipped with a plurality of such logic devices.

Logic circuits consisting of a plurality of freely programmable components forming reconfigurable systems are known in general. For example, an arrangement of programmable logic devices that can be coupled via programmable connections, depending on the current task (so-called field-programmable gate arrays, FPGA) may be provided. For programmability, FPGA circuits require semiconductor components which define the logic of the circuit with the help of a stored charge state. The ferroelectric materials used for this purpose are in principle capable of storing a charge for a long period of time and thus maintaining a defined state as a stable condition. However, one disadvantage is that reprogramming in which the charge is altered is associated with a mechanical load on the material used for storage. Therefore, the operating frequency and lifetime of logic devices using ferroelectric memories are limited.

The restriction to a certain number of switching cycles may be overcome with magnetic logic devices whose logic function is executed by a magnetoresistive element (hereinafter MR element), for example. MR elements have an electric resistance that can be altered by an external magnetic field on the basis of the GMR effect (GMR=giant magnetoresistive) or the TMR effect (TMR=tunneling magnetoresistive) and can be used to generate logic signals (see W. C. Black et al. in "Journal of Applied Physics," volume 87, 2000, pages 6674-6679).

MR elements are usually thin-layer components which can be switched any number of times and are therefore characterized in that a current operating state (magnetization state here) is stored without voltage (non-volatility of information). MR components therefore have a greatly reduced power consumption and they also in principle have the ability to read and write information with extremely short pulses (fs) and extremely high frequencies (GHz) (see T. Gerrits et al. in "Nature," volume 418, 2002, page 509). In the past, MR elements have been used as memory modules (MRAM, magnetic random access memory; see DE 198 53 447, for example), i.e., as passive components, because of the advantages mentioned above. There have also been attempts to use MR elements as active components in logic devices, as will be explained below.

DE 101 36 356 describes an MR element having three magnetizable layers forming a so-called magnetic diode. By switching the magnetization direction of one of the partial layers, a logic function may be inverted (e.g., AND to NAND) so that a function selection (negation) is possible to a limited extent. However, a freely programmable logic circuit, which also requires switching among various basic operations (e.g., AND to OR), cannot be implemented with the logic device according to DE 100 36 356.

DE 100 44 395 C1 proposes a module for a programmable magnetic logic having two MR elements, each with a magnetic information layer and a magnetic reference layer. Application of this module is limited to generation of two output signals that are mutually inverted.

The publication by W. C. Black et al. cited above describes a field-programmable magnetic logic circuit comprising multiple MR elements and the respective MR reference elements. At least three MR elements are needed to form a basic logic element. Which logic function is performed by the basic logic element is defined by a setting on an MR element and its respective MR reference element. The disadvantage of this conventional logic circuit is the great circuit complexity. In addition, switching of at least two MR elements is necessary for function programming.

In addition, in the publication cited above, W. C. Black et al. describe the logic function of a single MR element, as diagrammed schematically in FIG. 8. The conventional logic device 10' includes an MR element 11' with magnetizable layers (setting elements) 12', 13', two input lines 14', 15', an output line 16' and a RESET line 17'. The input lines 14', 15' are combined to form a common signal line 18' with which the MR element 11' is magnetizable. A logic OR operation is performed as follows with the logic device 10'.

First the MR element 11' is reset by having a predetermined RESET current applied to the RESET line 17'. The setting elements 12', 13' are thereby magnetized with antiparallel magnetization, for example (see arrows). Accordingly, the resistance of the MR element 11' is initially high so the logic output signal 0 corresponds to a logic "0". When a logic "1" signal is applied to at least one or to both of the input lines 14', 15' (input current: on), one of the layers (e.g., 12') is remagnetized while the other layer retains its magnetization. At the result, the resistance of the MR element is reduced, yielding an output signal of "1" (OR function). The corresponding NOR function can be achieved by reversing the magnetization of the other layer (here: 13').

One disadvantage of the logic device 10' with the individual MR element is that it is restricted to a certain logic function. In order to implement the AND function instead of the OR function, different signal currents must be set or different magnetic materials must be used.

Furthermore, an important disadvantage of the logic device 10' is that before each logic operation, the MR element must be brought to the specified output state by the RESET step. The RESET step serves only the purpose of setting the start state and thus constitutes an additional switching and time complexity which does not contribute to the actual logic operation.

DE 100 53 206 C1 describes a freely programmable logic device, likewise having an individual MR element which contains as magnetic setting elements two magnetic layers. The setting elements are magnetizable individually or jointly according to FIG. 8 by applying signal currents characteristic of logic input variables to an electric conductor. Depending on the prevailing magnetization, this yields a certain electric resistance of the MR element, which can be processed further as a logic output variable. With the logic device according to DE 100 53 206 C1, either the AND/NAND logic function or the OR/NOR logic function can be implemented. To switch between the two logic functions, an additional magnetic field is provided; this field is aligned perpendicular to the layers of the MR element, and the coercive field strength can be modified with this field with a so-called asteroid switching behavior. The logic function of the logic device changes, depending on whether or not the perpendicular magnetic field is applied. One disadvantage is that an additional magnetization device must be provided for generating the perpendicular magnetic field. Other disadvantages include restrictions with respect to the choice of material, the physical properties, the geometry and the dimensions of the setting elements to achieve the asteroid switching behavior demanded as essential according to DE 100 53 206 C1. In addition, with the logic device according to DE 100 53 206 C1, the additional RESET step is provided before each logic operation.

The conventional magnetic logic devices are thus characterized by the following disadvantages in general. With the conventional magnetic logic devices, not all physical properties (e.g., magnetism, symmetry) are utilized for the logic behavior of the MR elements. The design and operation of conventional magnetic logic devices are therefore excessively complex and expensive. The known magnetic logic devices are designed for a certain logic function or they can be switched to a different logic function only through complex measures, e.g., applying an additional perpendicular magnetic field or setting altered current values. This problem becomes even greater when a plurality of logic devices are to be integrated into a logic circuit. Selective programming of logic-devices is possible only to a limited extent and with a great complexity in terms of switching in a very time-consuming process. True magnetic freely programmable logic circuits have not yet been available. Although one approach might be for multiple groups of logic devices to be provided for one logic function within an integrated circuit and used as needed, this does not constitute function programming, but instead is merely selecting among components having permanently preset functions. The result is a high redundancy and a loss of usable integration density. With the conventional methods which are performed with non-magnetic circuit configurations, by analogy with the corresponding techniques using non-magnetic circuit arrangements, an increased integration density can be achieved only by reducing the size of structures. A second general disadvantage is the above-mentioned RESET function by which logic operations and thus the operation of logic circuits having a plurality of individual logic devices are slowed down.

The object of this invention is to provide improved methods for operating logic devices with which the disadvantages of the conventional techniques are overcome. Inventive Methods according to the invention should permit in particular free programmability of individual magnetic elements (magnetic components) for the various logic functions, while accelerating the sequence of logic operations and being implementable with a low complexity in terms of circuit technique. In particular, the integratability in the context of integrated logic circuits should be facilitated. Furthermore, the object of the present invention is to provide improved logic devices with which the disadvantages of conventional logic devices are overcome and which are characterized in particular by free programmability and a simple design with reduced restrictions with respect to the materials, geometry and dimensions of magnetic components.

These objects are achieved by methods and logic devices having the features according to Patent claims 1 or 14. Advantageous embodiments and applications are defined in the dependent claims.

A basic idea of this invention is to further improve upon a method for operating a magnetic logic device with which at least one logic operation is performed in which at least one logic output variable $O=F(I_A, I_B)$ is formed from logic input variables $(I_A, I_B)$ with a logic operator function F such that the logic device is set at a starting state for executing the operator function F before the operation with a certain operator control signal (SET), whereby the operator control signal is selected from a group of various control signals with which various non-volatile starting states of the logic device can be set in a controlled manner, each being characteristic for certain logic functions.

The inventive method has been developed on the basis of the following considerations by the inventors. The inventors have found that with magnetic elements, e.g., with MR elements having two magnetic layers with which four magnetically differentiable non-volatile states can be achieved so far, in the past only one certain state has always been used as the starting point for implementation of a logic function. The logic device has been reset at this specified state in the RESET step. By contrast, all the magnetically differentiable states of the logic device according to this invention are used as freely selectable starting states for executable logic operations. The setting of the prevailing state and thus the currently desired logic function (operator function F) as a selection of various non-volatile states from this group is made with the operator control signal. When different logic functions are to be executed over a course of time, a logic device is set accordingly with different operator control signals in succession.

According to the invention it is proposed in particular that magnetic logic devices can be operated sequentially with a single magnetic element, in particular a single MR element, as follows. First, there is a targeted setting or function programming of the logic device by a selection of the operator control signal from the group of different control signals with which different non-volatile starting states can be set, each state being characteristic of a different logic function (i.e., to select the desired operator function from the group of various logic functions) and a setting (SET) of the logic device by applying the selected operator control signal to the magnetic element. With the operator control signal, the logic device is set according to one of the possible non-volatile configurations. The function programming replaces various processes which have been carried out separately and with great effort with the conventional logic devices, namely selection of the logic function through the hardware technology on the one hand and the RESET step based on the software on the other hand.

The method according to the invention also constitutes an essential difference in comparison with conventional operation of non-magnetic circuit arrangements. In the case of non-magnetic FPGA circuits, temporary storage of the function programming and the corresponding cycle operation are not possible or are possible only for a limited period of time (stability of the memory layer).

An essential advantage of the invention is that the logic devices can be integrated into logic circuits and the logic devices (individual basic logic elements) contained in an integrated logic circuit can be used with increased efficiency by sequential function programming. With conventional logic circuits, four groups of logic devices have usually been included, each being designed for a certain logic function, but with a logic circuit operated according to this invention, all the logic devices may optionally be used for all currently desired logic functions. The functionality of a logic circuit can thus be fully retained with fewer logic devices (usually by a factor of 4).

According to a preferred embodiment of the invention, the operator control signal is selected from a group of various control signals to set starting states that are each characteristic of a logic function from the group of logic AND, OR, NAND and NOR functions of the logic device in a controlled manner. This embodiment may have advantages with respect to the flexibility of the function execution because all four basic logic functions that are of interest in practice are adjustable. According to an alternative embodiment of this invention, which may offer advantages with respect to a simplified design of the logic device, the control signals are selected so that with them it is possible to set starting states, each of which is characteristic of a logic function from the group of either the logic AND and OR functions or the logic NAND and NOR functions.

When the control signals include control current signals under the influence of which magnetic fields are generated by means of which the respective logic function is set in the magnetic element, then further advantages can be achieved with respect to the implementation of the inventive method with available structures of magnetic components. It is particularly advantageous when the control current signals are sent to the logic device via input lines for input of the input variables ($I_A$, $I_B$). In this embodiment, the design of a logic circuit with a plurality of integrated logic devices is simplified. Furthermore, the control current signals may have constant current values. This constitutes a considerable advantage in comparison with conventional techniques (see W. C. Black et al.) in which various current amounts must be input for switching the logic function under some circumstances. Alternatively, the control signals may include switching signals for remagnetization of the respective magnetic elements by current-induced switching. In this case, advantages may be derived from direct current-induced switching of the magnetization direction.

The control current signals may be formed by continuous switched currents which are applied to the magnetic element. However, a further improvement in capability can advantageously be achieved with the electronic circuits used in practice, and a reduction in energy consumption and thus in the evolution of heat may be achieved if the control current signals include switched-mode or pulsed currents.

The logic device typically receives input current signals for input of the logic input variables ($I_A$, $I_B$). The input current signals are preferably formed so that they have the same values as the control current signals.

This invention can be carried out in general with all magnetic logic devices having at least one magnetic element with multiple magnetically differentiable non-volatile states. For example, a magnetoresistive element has at least two magnetic setting elements with different coercive field strengths on which one of at least two starting states is adjustable with the operator control signal. According to one embodiment of this invention, the coercive field strengths and the current values of the current signals are coordinated so that both setting elements can be adjusted by the operator control signal. Therefore, all four possible configurations of magnetization directions can be achieved with two setting elements. In this mode, both setting elements are freely adjustable ("unpinned"). Alternatively, the coercive field strength is selected to be so high by one of the setting elements that it cannot be adjusted with the current signals ("pinned" mode). In this case, only two configurations of magnetization settings can be implemented as the starting state and thus only two logic functions are implementable. However, there may be advantages with respect to the simplicity of the design of the logic device.

Another subject of the invention is a method for operating a magnetic logic circuit comprising a plurality of logic devices with which one logic operation may be performed at the same time or a plurality of logic operations can be performed in succession according to the method described above.

Each logic device can advantageously execute the same or different logic operations continuously or in succession according to a specified work cycle. This makes it possible to avoid redundancy and greatly increase the efficacy of the logic circuit.

Another subject of the invention is a magnetic logic device with at least one logic magnetic component, at least two inputs and at least one output equipped to execute at least one logic operation in which at least one output variable $O=F(I_A, I_B)$ is formed from input variables ($I_A$, $I_B$) with an operator function F, whereby the magnetic element is connected to a control circuit for generating a certain operator control signal for executing the operator function F from a group of different control signals, each characteristic of a different logic function.

According to a preferred embodiment of the invention, the control circuit has a current source for generating various current control signals according to various logic functions and a switching device with which one of the current control signals can be sent as an operator control signal to the magnetic element.

The circuit device may operate as a program-controlled device, for example. Further advantages may be obtained when the control circuit has an operator function selector to which the circuit device is connected.

According to a preferred embodiment of the logic device, the at least one magnetic element is a magnetoresistive element (MR element). Advantages may be achieved in that magnetoresistive elements are already available per se and are easy to handle in use. However, implementation of this invention is not limited in principle to MR elements but instead it may be implemented in general with magnetic setting elements whose relative orientation is detectable, e.g., with optical or magnetostrictive elements.

Essential advantages of the inventive logic devices consist of the fact that (1) they are universally usable, i.e., as logic elements or as memory elements, (2) they are freely programmable, i.e., the desired logic functions can be set, and (3) they are non-volatile (information and logic functions remain intact). In addition, they are characterized by a maximum simplicity in design. Restrictions to certain materials or geometries can be avoided.

Figure 2:
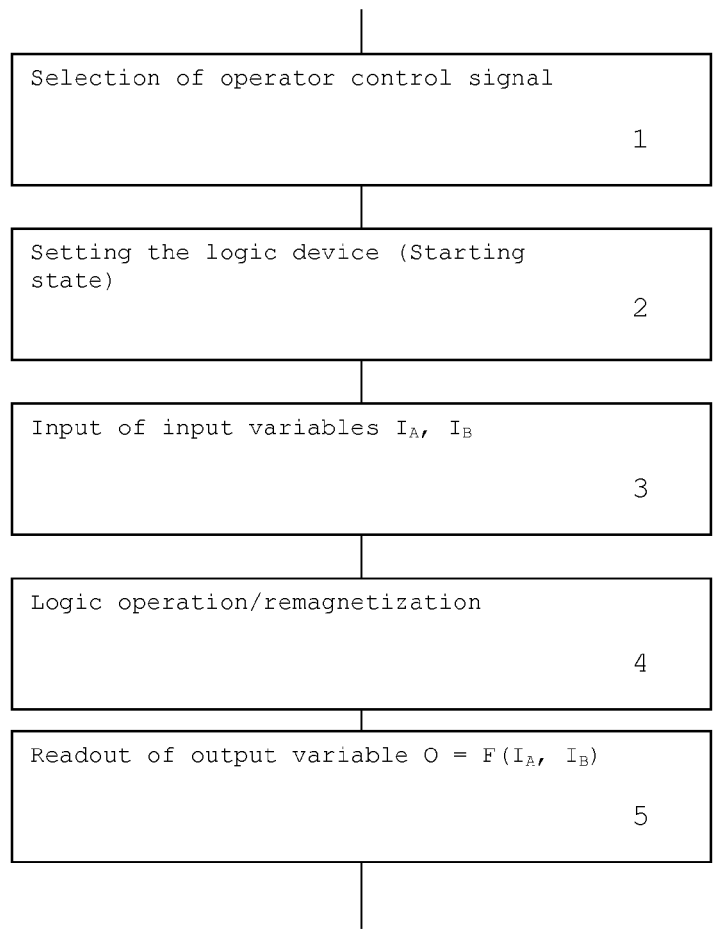
Figures 3, 4:
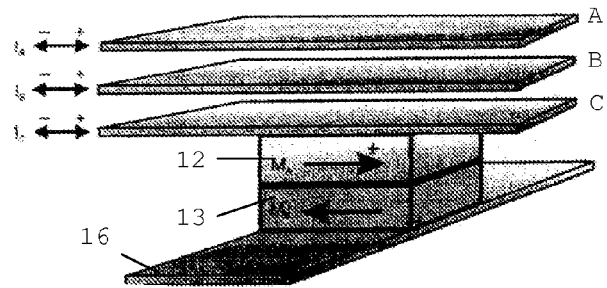
Figure 5:
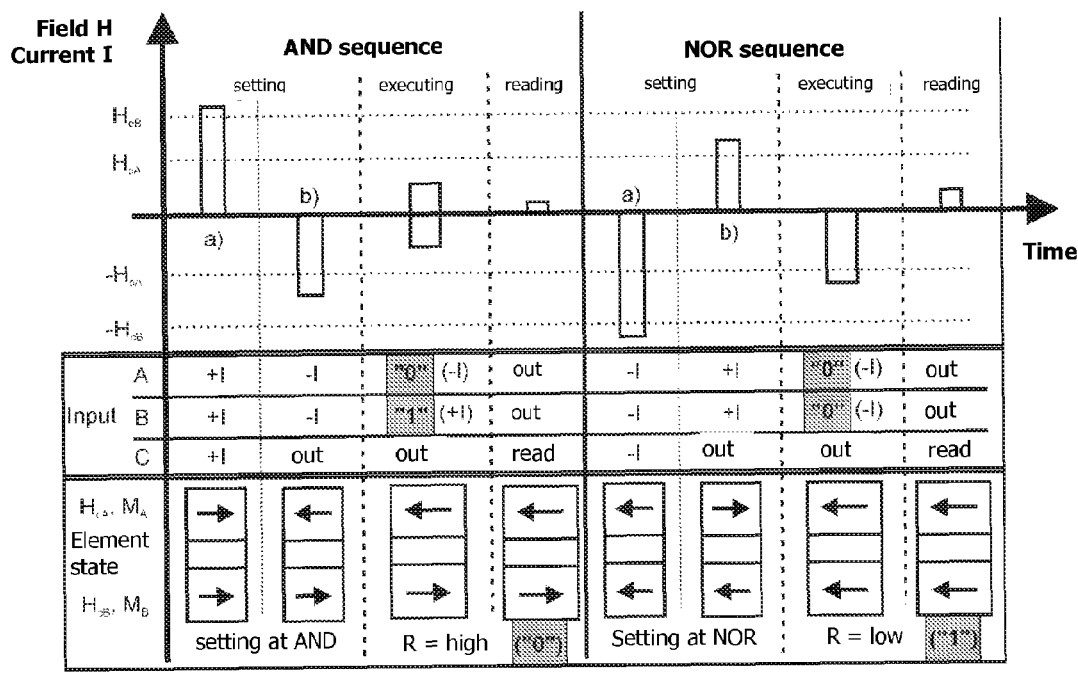
Figure 6:
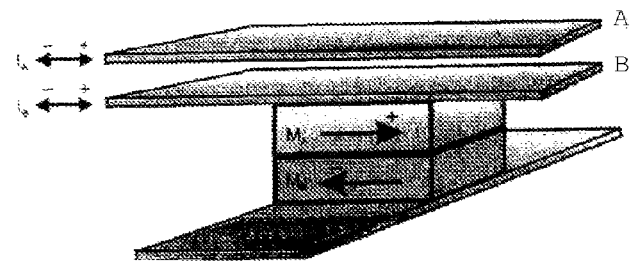
Figure 7:
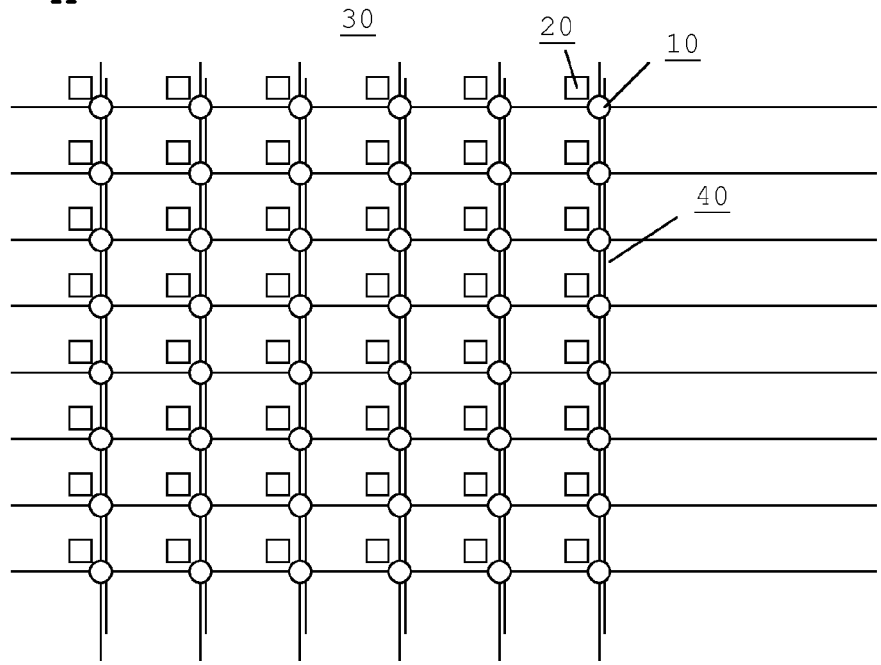
Figure 7:
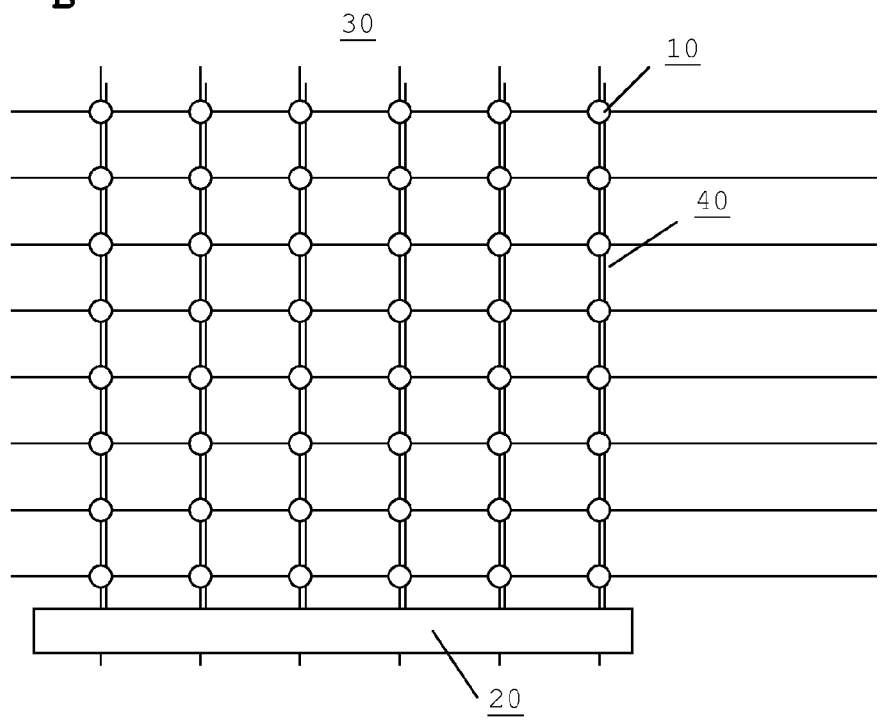
Figure 8:
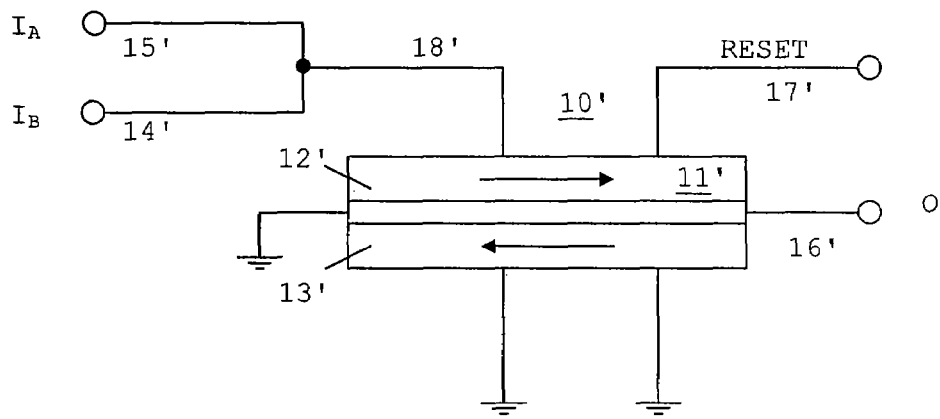

Other advantages and details of the invention are apparent from the following description of the accompanying drawings, which show:

FIG. 1: a schematic diagram of a logic device according to the invention,

FIG. 2: a flowchart to illustrate the method according to the invention,

FIG. 3: a perspective view of a first embodiment of an MR element used according to the invention, FIG. 4: a table summarizing the four magnetic starting states of the MR element and the respective logic functions, FIG. 5: examples of clock sequences in operation of the logic devices according to the invention, FIG. 6: a perspective view of another embodiment of an MR element used according to this invention, FIGS. 7A, 7B: schematic diagrams of logic circuits a plurality of logic devices, and FIG. 8: a schematic diagram of a conventional logic circuit (state of the art).

Implementation of the invention is described below after a general description of FIG. 1 with exemplary reference to the use of magnetoresistive thin-layer components. However it should be emphasized that the use of MR thin-layer components is not absolutely necessary. Instead, the inventive method may be implemented in general with magnetic components which allow the use of various magnetically differentiable starting states as logic functions. In addition, the invention is not necessarily limited to magnetic components with two inputs and one output but instead can also be implemented with more inputs or outputs.

The group of magnetic elements that can be used according to the invention includes in particular those MR elements based on such magnetoresistance effects as AMR (anisotropic magnetoresistance), GMR (giant magnetoresistance), TMR (tunneling magnetoresistance), CMR (colossal magnetoresistance) and GMI (giant magnetoimpedance)(see brochure "XMR Technologies" Technology Analysis: Magnetism, volume 2, VDI Technology Center "Physical Technologies," Düsseldorf, Germany, 1997, pages 11-46).

The parameters of the MR elements such as the materials, the thicknesses, geometries, amperages, etc. are selected in the manner known per se for conventional applications of MR elements.

Finally it is emphasized that the implementation of the invention is not limited to the logic functions listed below as examples but instead can be used with logic functions derived therefrom or arithmetic functions or other logic functions, e.g., complement formations, bit-based inquiries, comparisons, inversions, etc.

FIG. 1 shows schematically an inventive logic device 10 with a magnetoresistive component 11 (MR element 11) having two magnetic setting elements 12, 13, each with two magnetically differentiable states, and a control circuit 20. The setting elements 12, 13 of the MR element 11 are made of magnetic materials, one material being magnetically softer than the other material. The magnetic states differ through the respective magnetization directions of the setting elements 12, 13. The logic device 10 includes at least two inputs 14, 15 and at least one output 16 which are provided for input and output of logic input and output variables on the MR element 11. The inputs 14, 15 are connected to at least one electric signal conductor with which a magnetic field is induced when acted upon by an electric signal current, causing the magnetization direction of at least one of the setting elements 12, 13 to be variable. The output 16 is part of a current circuit (not shown) in which the electric resistance of the MR element 11 is measurable by a method that is known per se. It should be emphasized that the logic output variable $O=F(I_A, I_B)$ can as an alternative be detected by other measurement methods which are suitable for differentiating between parallel and antiparallel configurations of the two magnetic setting elements, e.g., in optical or magnetostrictive methods.

The control circuit 20 serves to generate the operator control signal and includes, for example, a current source 21, a switching device 22 and optionally an operator function selector 23. The current source 21 is connected by the switching device 22 to at least one electric conductor with which the magnetization direction of at least one of the setting elements 12, 13 is variable. This conductor may be provided as an independent component, but it is preferably combined with the at least one signal conductor of the inputs 14, 15. Details of the connection of the control circuit 20, the inputs 14, 15 and the output 16 to the MR element 11 are illustrated as an example is FIGS. 3 and 6 (see below).

FIG. 2 shows the essential steps of the inventive method. FIG. 2 shows a detail of the function sequence in operation of a logic device pertaining to the execution of the logic function. Additional details of the function sequence are known of conventional FPGA circuits per se and therefore will not be described here. According to FIG. 2, first, the operator control signal SET is selected; this is the sign al that is characteristic of the execution of a certain logic function (step 1). The operator control signal SET is selected from a group of various control signals, each of which is characteristic of various logic functions. The choice is made by appropriate input to the control circuit 20, e.g., by a control program or with the operator function selector 23. The possibility of a software-based selection of the logic function constitutes an essential advantage of the invention. In step 2, the control circuit 20 receives the currently selected operator control signal SET, so that a starting state according to the desired operator function F is set. With the operator control signal SET, the magnetizations of the setting elements 12, 13 are set as parallel or antiparallel, for example, in a single step or in two substeps to form the starting state for the subsequent logic operation (steps 3, 4).

To do so, the inputs 14, 15 are acted upon by the input variables ($I_A$, $I_B$) (step 3) so that the magnetizations of the setting elements 12, 13 are set in a characteristic manner. The input variables are formed, for example, by current signals, each representing a logic "1" or "0", depending on the direction of the current. The current signals may lead to maintaining the starting state or to remagnetization of at least one of the setting elements 12, 13 (step 4). The configuration of the two setting elements 12, 13 remains the same or is altered as a result. In the case of an MR element (11), a characteristic voltage or current variable is read out at output 16 for the instantaneous resistance (step 5). The output variable O depends on the starting state, which is determined by the operator function F and the input variables ($I_A$, $I_B$): $O=F(I_A, I_B)$.

According to the invention, a plurality of logic operations may be executed subsequently, with the sequence according to FIG. 2 being run through repeatedly accordingly. Steps 1 and 2 may be modified in particular when an end state of the magnetic element corresponds to the desired starting state for the following logic operation. In this case, step 2 may be omitted because the setting of the magnetic element has been performed by the previous logic operation.

A linkage of the MR element 11 with the inputs 14, 15 and the output 16 that can be used according to this invention is depicted in FIG. 3 as an example. A GMR element with two magnetic layers 12 and 13 with the respective magnetizations M12 and M13 and the respective coercive field strengths HC12 and HC13 is provided as the MR element; in the selected example, HC12 is smaller than HC13. The sequence of layers with different coercive field strengths may be reversed in a modified embodiment. The layers 12 and 13 are magnetically insulated from one another, as is known for conventional MR elements. The voltage drop (measurement voltage) that can be picked up at the output 16 as output variable O (output) depends on the relative orientation of the two magnetizations with respect to one another.

The GMR element 12, 13 receives electric current through three signal conductors A, B and C (input) which are connected to the inputs 14, 15 and the control circuit 20. The three independent signal conductors A, B and C are electrically insulated from one another and receive the respective currents $I_A$, $I_B$ and $I_C$, the absolute values of which may expediently be the same. The resulting magnetic fields $H_A$, $H_B$ and $H_C$ created in this way are superimposed and serve according to the invention both as a SET function and as a logic input signal. The signal conductors A, B and C are shown with a distance between them in FIG. 3 only for the sake of simplicity in the diagram. In practice, they may be in contact or may even be formed by a common signal conductor having terminals for the inputs 14, 15 and the control circuit 20.

For the diagram shown in FIGS. 4 and 5, the relationships between the magnetic fields $H_A$, $H_B$ and $H_C$ generated by the signal conductors and the coercive field strengths $H_{C12}$ and $H_{C13}$ are as follows: each field $H_A$, $H_B$ and $H_C$ by itself is smaller than $H_{C12}$ and the sum of $H_A+H_B$ is greater than $H_{C12}$ but is smaller than $H_{C13}$ and the sum of $H_A+H_B+H_C$ is greater than $H_{C13}$. As a result, no current can by itself rotate one of the two magnetizations. The currents of the signal conductors A and B rotate the magnetization of layer 12 only together while the magnetization of layer 13 can be rotated only by all three input currents together. This is true only for currents in the same direction. Currents in opposite directions mutually nullify one another.

The logic input variables represented by the directions of the current are formed by the current signals $I_A$, $I_B$, for example. The respective current direction +I is identified by the magnetization direction +M which it prefers and which is represented below by an arrow to the right (see FIG. 3). This current direction (+I) is identified with a logic "1" and the opposite current direction "−I" is represented by a logic "0" In addition, a high magnetoresistance (antiparallel magnetization) represents a logic "0" as the output while a low magnetoresistance (parallel magnetization) represents a logic "1". These global definitions define the switching behavior of the logic device. The electric current may be applied in short, switched pulses (duration depending on application, e.g., in the fs to ms range, frequency, e.g., in the GHz to kHz range) so that the energy consumption and thus the heating of the element can be minimized.

Due to the inventive targeted flow of current in the three signal conductors in step 2 (FIG. 2), the four magnetically differentiable configurations of a simple GMR element which are possible in principle can be defined as starting states represented in two substeps, as summarized schematically in FIG. 4.

Application of the operator control signal (SET sequence) consists of two successive substeps. First by simultaneously applying current to all three signal conductors A, B and C, the direction of magnetization of the layer 13 which is the harder magnetic layer is set: for example, +I at all inputs leads to $+M_{13}$ (layer 12 is set in exactly the same way). Then by simultaneously applying current to A and B, only the layer 12 which is the softer magnetic layer, is set, e.g., −I at inputs A and B leads to $-M_{12}$; $M_{13}$ is not influenced further. The four variants of possible starting states are shown in the left column of FIG. 4.

The logic operation (steps 3, 4 and 5 in FIG. 2) includes the following input of the input variables. First the inputs 14 and 15 and accordingly the signal conductors A and B receive current signals separately. When the currents of both inputs are in the same direction (signal conductors A and B both at +I or −I), rotation of the magnetization is possible. Otherwise (currents in opposite directions) rotation of the magnetization is impossible. Depending on the SET sequence selected in the software, this yields various end states after the logic operation. When the end state is parallel, the magnetoresistance is low and the output variable (output) is a logic "1". When the end state is antiparallel, the magnetoresistance is high and the output variable is a logic "0".

The four possible output variables from the four different starting states are summarized in the right column in the logic tables in FIG. 4. These correspond to the four logic functions OR, AND, NOR and NAND. The logic OR function (first line, FIG. 4) is obtained as follows, for example.

First, the logic function OR is defined by the SET sequence. In the first substep, layer 13 is set at +M by applying +I to all three signal conductors A, B and C. Then layer 12 is set at +M and thus OR is defined by applying +I current to the signal conductors A and B. Now the magnetization is parallel magnetization to the right and thus the magnetoresistance is low (logic "1").

Then in the second step the signal conductors A and B receive current separately to perform the logic operation. This yields the following four possibilities:

1. If both signal conductors are set at "0," i.e., if they receive −I current, the magnetization of layer 12 is rotated. The magnetizations are now antiparallel, the magnetoresistance is high and thus the output is at "0" (see top line in the logic table).
2. If the signal conductor A is set at "0" and the signal conductor B is set at "1," i.e., it receives −I or +I, then the two fields compensate one another and the magnetization set by the SET sequence is maintained (output "1").
3. Signal conductor A at "1" and signal conductor B at "0" is equivalent to case 2 (output "1").
4. If both signal conductors are set at "1," i.e., if they receive +I current, this is only a repetition of the second substep of the SET sequence, which sets layer 12 at +M. The output variable is again "1" because the two magnetizations are still parallel to one another.

For all possibilities 1 through 4 the magnetization of the setting element 13 remains the same. A complete logic table is advantageously made available, in this case representing the OR function.

The inventive sequence of the switching is illustrated in FIG. 5 on the example of a logic AND with a subsequent NOR sequence corresponding to the logic functions indicated in FIG. 4.

A SET sequence (step 2 in FIG. 2) of two substeps A and B is followed by a step for executing the logic operation (steps 3, 4) and another step for readout of the output (step 5). The first substep selects via the layer 13 the logic at non-negation $(-M_{13})$ or negation $(+M_{13})$. The second substep sets the logic operation at OR $(+M_{12})$ or AND $(-M_{12})$. Subsequent execution of the logic operation may result in a change in the direction of magnetization of the layer 12 (as in the second case illustrated here) or not (as in the first case). The concluding reading step may expediently be performed by applying a reading current, which flows through the MR element and can be picked up via the output line 16, to one of the three signal conductors (over signal conductor C in the present case). As an alternative, there is the possibility of implementing the readout with a circuit that is separate from the signal conductor but is connected to the output line 16 by analogy with the design according to FIG. 8.

After executing the logic function, no separate RESET is necessary according to the invention; that is an advantage because the next two SET substeps in turn put the MR element in one of the four defined states. This may also yield advantages due to the fact that depending on the output of the previous logic function, the next following logic function is already preselected and the SET sequence may be omitted.

FIG. 6 illustrates an alternative embodiment of this invention having only two inputs. If the third signal line C is omitted, the layer 13 which is the harder magnetic layer may be remagnetized only via larger currents $I_A/I_B$. Nevertheless by analogy with the above analysis, two logic operations (OR and AND) may still be executed even with a fixed magnetization direction of the layer 13 (pinned mode), in which case the SET sequence does not include two substeps but instead includes only one step in which the layer 12 is set to be parallel (OR) or antiparallel (AND) to the layer 13.

An important advantage of this invention may consist of the compatibility with operation of memory devices. If the logic operation is eliminated completely, a circuit is made available which functions like a conventional MRAM memory unit.

In summary, it should be noted that the invention provides a freely programmable logic device which is based on at least two magnetic setting elements, e.g., at least one individual MR element with at least two inputs. By means of the inventive wiring of the SET sequence in one or two substeps, it is possible to make accessible two or four fundamental logic functions (OR, AND, NOR and NAND) with a single component without requiring additional means such as voltages, magnetic fields or other MR elements.

FIGS. 7A, 7B show details of an inventive logic circuit 30 a plurality of logic devices 10 arranged in a matrix. FIG. 7A shows each of the logic devices 10 equipped with control circuit 20 by analogy with FIG. 1. Alternatively, FIG. 7B shows multiple or all logic devices 10 each connected to a common control circuit 20. The logic devices 10 are preferably configured as an integrated circuit and linked via a network 40 of reading and writing lines as is known per se of conventional FPGA circuits or MRAM arrays.

The features of this invention disclosed in the preceding description, the claims and the drawing may be important for the implementation of this invention in its various embodiments either alone or in combination.

The invention claimed is:

1. A method for operating a magnetic logic device connected to a control circuit, the logic device comprising one single magnetic element that comprises two magnetic setting elements, each with two magnetically differentiable states which are set with an operator control signal SET for execution of at least one operator function F;
   wherein the control circuit has a current source and a switching device via which the two magnetic setting elements can receive the operator control signal SET;
   wherein the at least one output variable O=F (IA, IB) is formed by at least one logic operation from input variables IA, IB with the operator function F of the magnetic logic device, comprising the steps of:
   selecting an operator control signal SET from a group of control signals with which various non-volatile starting states can be set in a controlled manner, each signal being characteristic of a different logic function,
   setting the starting state of the magnetic logic device for executing the operator function F with the selected operator control signal SET, and subsequently
   executing the operation with the magnetic logic device.

2. The method according to claim 1, in which starting states can be set with the control signals, each state being characteristic of a logic function from the group of logic AND, OR, NAND and NOR functions.

3. The method according to claim 1, wherein starting states can be set with the control signals, each state being characteristic of a logic function from the group of logic AND and OR functions or logic NAND and NOR functions.

4. The method according to claim 1, wherein the control signals are control current signals under the influence of which magnetic fields are generated or they include switching signals under the influence of which remagnetization occurs, wherein the respective logic function is set in the logic device by the magnetic fields or the remagnetization.

5. The method according to claim 4, wherein the control current signals are sent via input lines into the logic device.

6. The method according to claim 4, wherein the control current signals have constant current values.

7. The method according to claim 4, wherein the control current signals include switched-mode currents.

8. The method according to claim 1, wherein the logic device receives input current signals for input of the logic input variables $I_A$, $I_B$.

9. The method according to claim 8, wherein the control signals are control current signals and the input current signals and the control current signals have the same values.

10. The method according to claim 1, wherein the magnetic element has two magnetic setting elements, whereby the coercive field strengths and the current values of the input current signals are coordinated so that both setting elements can be set by the operator control signal.

11. The method according to claim 1, wherein the magnetic element has two magnetic setting elements, whereby the coercive field strength of one of the setting elements is selected to be so high that it cannot be changed with the input current signals.

12. The method for operating a magnetic logic circuit, comprising a plurality of logic devices with which a plurality of logic operations may be executed either simultaneously or in succession according to a method as characterized in claim 1.

13. The method according to claim 12, wherein each logic device executes the same or different logic operations in succession.

14. A logic device having at least two inputs and at least one output, whereby the logic device is provided with at least one logic operation for execution, wherein at least one output variable O=F($I_A$, $I_B$) is formed from input variables $I_A$, $I_B$ with an operator function F, wherein:
   the logic device is connected to a control circuit, which is equipped for providing an operator control signal that is selected from a group of control signals with which various non-volatile starting states of the logic device that are characteristic of various logic functions can be set, and for setting the logic device at a starting state corresponding to the operator control signal, and
   the logic device comprises one single magnetic element that comprises two magnetic setting elements, each with two magnetically differentiable states which are set with the operator control signal SET for execution of the operator function F;
wherein the control circuit has a current source and a switching device via which the two magnetic setting elements can receive the operator control signal.

15. The logic device according to claim 14, wherein the control circuit has an operator function selector with which the operator control signal is selectable.

16. The logic device according to claim 14, wherein the magnetic element includes a magnetoresistive element.

17. A logic circuit having a plurality of logic devices according to claim 14.

18. The logic circuit according to claim 17, wherein each logic device is connected to a separate control circuit.

19. The logic circuit according to claim 17, wherein the logic devices are connected in groups or collectively to a common control circuit.

* * * * *